(12) United States Patent
Lindkvist et al.

(10) Patent No.: US 6,647,540 B2
(45) Date of Patent: Nov. 11, 2003

(54) METHOD FOR REDUCING EMI AND IR-DROP IN DIGITAL SYNCHRONOUS CIRCUITS

(75) Inventors: Hans Lindkvist, Lund (SE); Lars Svensson, Göteborg (SE)

(73) Assignee: Telefonaktiebolaget LM Ericsson(Publ), Stockholm (SE)

( * ) Notice: Subject to any disclaimer, the term of this patent is extended or adjusted under 35 U.S.C. 154(b) by 0 days.

(21) Appl. No.: 10/035,398

(22) Filed: Nov. 8, 2001

(65) Prior Publication Data

US 2003/0088835 A1 May 8, 2003

(51) Int. Cl.⁷ ................................................. G06F 9/45
(52) U.S. Cl. ............................................ 716/10; 716/6
(58) Field of Search ................................... 716/6, 10, 2

(56) References Cited

U.S. PATENT DOCUMENTS

| | | | |
|---|---|---|---|
| 5,410,491 A | 4/1995 | Minami | 364/491 |
| 5,416,918 A | 5/1995 | Gleason et al. | 395/550 |
| 5,467,033 A | 11/1995 | Yip et al. | 326/93 |
| 5,481,209 A | 1/1996 | Lim et al. | 326/93 |
| 5,557,779 A | 9/1996 | Minami | 395/500 |
| 5,649,167 A | 7/1997 | Chen et al. | 395/500 |
| 5,691,662 A | 11/1997 | Soboleski | 327/292 |
| 5,712,585 A | 1/1998 | Jeong | 327/293 |
| 5,889,682 A | 3/1999 | Omura et al. | 364/491 |
| 5,974,245 A | 10/1999 | Li et al. | 395/500.11 |
| 6,272,667 B1 * | 8/2001 | Minami et al. | 716/6 |
| 6,341,363 B1 * | 1/2002 | Hasegawa | 716/6 |
| 6,440,780 B1 * | 8/2002 | Kimura et al. | 438/129 |
| 6,442,737 B1 * | 8/2002 | Tetelbaum et al. | 716/5 |
| 6,442,739 B1 * | 8/2002 | Palermo et al. | 716/6 |
| 6,442,740 B1 * | 8/2002 | Kanamoto et al. | 716/6 |
| 6,470,483 B1 * | 10/2002 | Rodriguez et al. | 716/6 |
| 6,543,042 B2 * | 4/2003 | Kato | 716/10 |

FOREIGN PATENT DOCUMENTS

| | | |
|---|---|---|
| EP | 1 085 434 | 3/2001 |
| WO | WO 00/75815 | 12/2000 |

OTHER PUBLICATIONS

Kourtev et al., "*Clock Skew Scheduling for Improved Reliability via Quadratic Programming*"; Computer–Aided Design, 1999, Digest of Technical Papers, 1999 IEEE/ACM International Conference, Nov. 1999; 5 pages.

Standard Search Report; Issued by European Patent Office on Jun. 6, 2002; 3 pages.

* cited by examiner

Primary Examiner—John F. Niebling
Assistant Examiner—Stacy Whitmore
(74) Attorney, Agent, or Firm—Jenkens & Gilchrist, P.C.

(57) ABSTRACT

A method for designing a synchronous digital circuit that exploits clock skew so as to reduce EMI and IR-drop. The circuit has a plurality of storage elements connected to combinational logic blocks, each of the storage elements being driven by a clock signal distributed from a clock device; and the method involves substantially maximizing the clock skew in the circuit subject to one or more constraints on the design of the circuit.

15 Claims, 2 Drawing Sheets

METHOD FOR REDUCING EMI AND IR-DROP IN DIGITAL SYNCHRONOUS CIRCUITS

BACKGROUND OF THE INVENTION

1. Field of the Invention

The present invention relates generally to the field of digital circuit design; and, more particularly, to a method for designing a synchronous digital circuit which exploits clock skew so as to reduce EMI and IR-drop in the circuit.

2. Description of the Prior Art

In the design of synchronous digital circuits, clock signals are used to synchronize computations performed in the circuits. The function of the clock signals is to reduce the uncertainty in delay between sending and receiving storage elements in the circuit. Storage elements, such as latches and flip-flops, for example, sample output signals of combinatorial logic, internally preserve the values as the state of the circuit, and make the state available for new computations after a certain delay.

A storage element makes its internal state available by driving its output signal to a corresponding voltage level. When a new voltage level is higher than a previous voltage level, current is briefly drawn from a voltage supply to charge the signal capacitance. Conversely, when the new level is lower than the previous level, current is briefly dumped into the ground network.

Most currently utilized schemes for distributing clock signals to storage elements in digital circuits concentrate on ensuring a high degree of synchronicity of all clock signals. To achieve this, clocks are typically distributed in a tree-like structure in such a manner that delays in different branches of the structure can be balanced to a high degree. The major benefit of such schemes is that uniformity brings predictability and simplifies the overall problems associated with designing the circuit.

Alternatives to maximally-balanced clock distribution networks are also known in the art, but are less frequently utilized. For example, in unidirectional pipelines, it is common practice to distribute the clock signal in a direction opposite to the data flow. Complex ASIC (Application Specific Integrated Circuit) designs, however, are rarely suitable for this method, inasmuch as their data flow is complex and irregular. Performance tuning through intentional clock skew is also used, either through explicit designer decisions to re-distribute computation time between two pipeline stages, or through the use of special CAD tools, such as the tool "ClockWise" offered by Ultima Interconnect Technologies.

An effect that is encountered in highly balanced clock distribution networks is that the outputs of all storage elements in the network are caused to toggle virtually simultaneously. As a result, the capacitive loads driven by the flip-flop outputs are also charged virtually simultaneously, thus briefly drawing a large current (a "current spike") from the supply. Such current spikes are undesirable for several reasons. For example, some significant problems that are caused by current spikes include:

Metal migration in supply wires is a major reliability problem. The rate of migration depends strongly on the maximum current density which occurs in the wire. Large current spikes thus require wider supply wires with the concomitant cost in area.

Large current spikes feature large values of dI/dt. Together with the parasitic inductance present in the IC package, the current spikes thus cause voltage fluctuations on the supply lines. These fluctuations can cause both a malfunction of the digital circuits and reduced performance level of co-located RF circuitry. Means to address these problems include advanced packaging and on-chip decoupling capacitance, both of which increase costs.

The large current spikes themselves can couple inductively into other parts of the design and cause a malfunction or a reduction in performance.

In addition to the above operational problems, highly balanced clock distribution schemes frequently cause problems during design of the circuits. For example, the arrival times of the clock signals to different registers depend on the detailed layout of the circuits; and is, therefore, difficult to predict. Practical design methods, therefore, usually include a margin of error to account for this imprecision. The introduction of this margin of error, however, reduces the maximum performance of the circuits; and, thus, high-performance circuits tend to be designed with small uncertainty margins for clock signal arrival, increasing the demands on the layout extraction process and complicating timing convergence.

SUMMARY OF THE INVENTION

The present invention recognizes that by not balancing the clock tree; or, by deliberately making the clock tree unbalanced or skewed, problems such as those described above can be significantly reduced.

In particular, the present invention provides a method for designing a digital circuit that includes a plurality of storage elements connected to combinational logic, each of the plurality of storage elements being driven by a clock signal distributed to the plurality of storage elements from a clock device. A method, according to the invention comprises the step of substantially maximizing clock skew in the circuit subject to one or more constraints on the design of the circuit.

Basically, the present invention uses the set of permissible ranges for clock skew, preferably calculated by means of Static Timing Analysis, to calculate a robust clock skew schedule that gives the circuit good EMI and IR-drop properties. In effect, a certain amount of robustness is decided upon, and then the rest of the permissible range is used to reduce EMI and IR-drop.

According to an embodiment of the present invention, the clock signal is subjected to certain insertion delays as it is distributed to each of the plurality of storage elements, and the step of substantially maximizing clock skew comprises selecting values for the insertion delay to each of the plurality of storage elements such that the variance of the insertion delays among the storage elements is maximized subject to the one or more constraints.

According to a presently preferred embodiment of the invention, the one or more constraints include robustness constraints constraining the insertion delays such that overall global robustness reaches a maximum value allowed for loops and combinational logic blocks in the circuit, and external scheduling constraints. Since the variance is a quadratic form, Quadratic Programming is preferably used to find a set of values for the insertion delays which maximize the variance given the robustness constraints such as indicated above.

According to further embodiments of the present invention, maximizing the variance of the insertion delays among the storage elements can be made subject to other constraints on the design of the circuit. For example, constraints may be included to reduce gate count and routing congestion. Also, some circuits designed according to the present invention may contain loops which are too closely coupled, and this may limit the amount of robustness that can be reached. According to other embodiments of the invention, this problem can be helped by adding buffers to the circuit at appropriate locations to make the shortest paths in the circuit longer, to optimize logic for maximizing the min-delays or by imposing opposite edge devices, flip-flops or latches at appropriate locations in the circuit to increase scheduling freedom.

A system that uses a clock distribution system designed in accordance with a method of the present invention will be more robust against uncontrollable clock skew than a system that utilizes the maximally-balanced schemes that prevail in the prior art. The system will also have better EMI and IR-drop properties than a system designed using the maximally-balanced scheme or a system designed such that clock skew is optimized for performance only.

Yet additional objects, features and advantages of the present invention will become apparent hereinafter in conjunction with the following detailed description of presently preferred embodiments.

DETAILED DESCRIPTION OF PRESENTLY PREFERRED EMBODIMENTS

Figure 1:
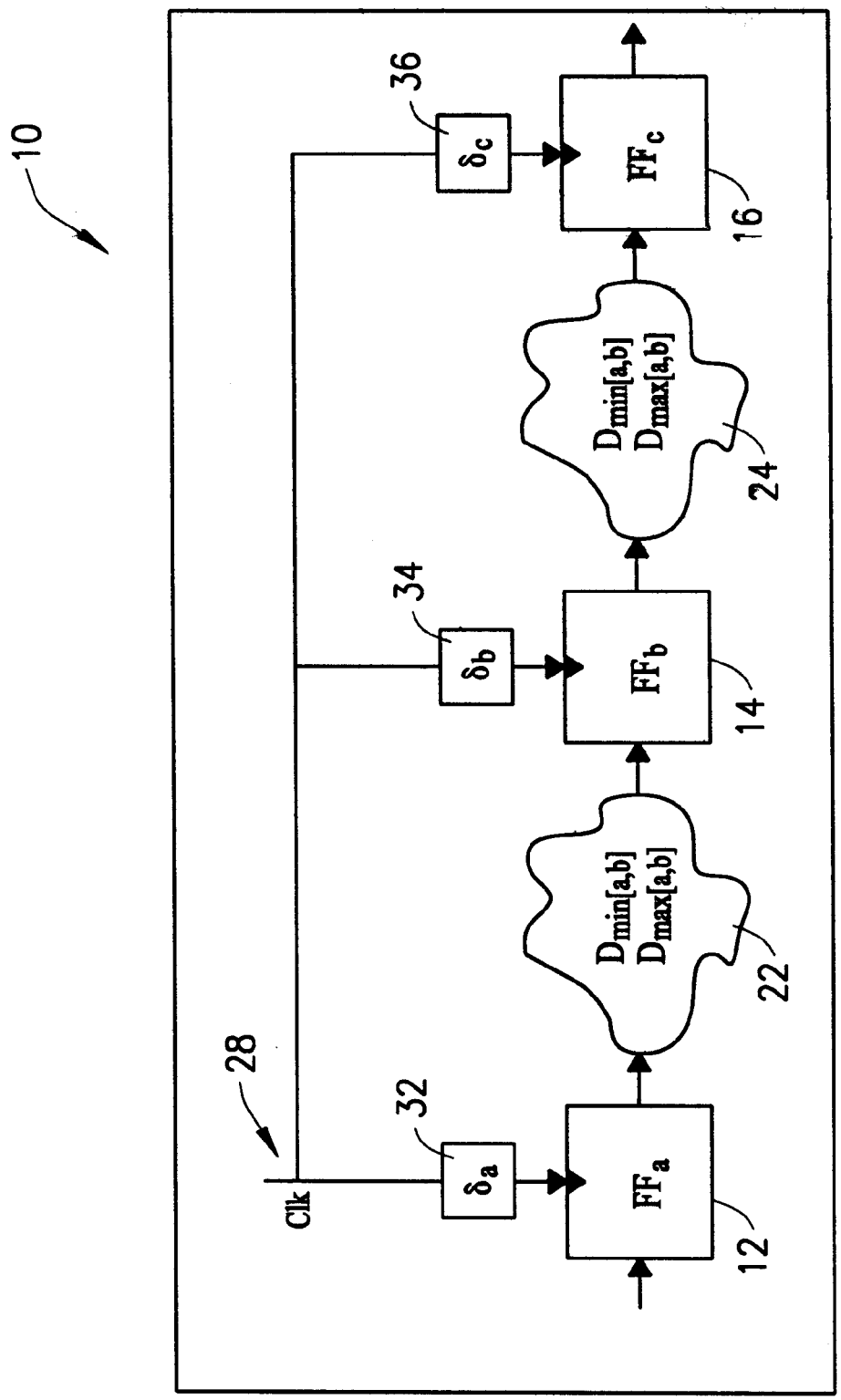
FIG. 1 schematically illustrates a digital circuit to assist in explaining the present invention.

FIG. 1 schematically illustrates an integrated circuit (IC) chip, generally designated by reference number 10, that is provided to assist in explaining the present invention. As is known to those skilled in the art, IC chip 10 will typically be carried on a larger circuit board (not shown) together with a number of other chips. The circuit board may itself comprise an entire digital system or form a part of an even larger system.

Integrated circuit chip 10 may be specially formed, i.e., be an application specific integrated circuit (ASIC) or it may be a generally available off-the-shelf device such as a microprocessor, a synchronous random access memory, or the like.

The circuit 10 of FIG. 1 is a clocked circuit having three storage elements or registers 12, 14 and 16 connected to two blocks of combinational logic, designated by reference numbers 22 and 24. It should be understood that this circuit is intended to be exemplary only, as it may include any number of storage elements and combinational logic blocks; and, typically, will include a larger number of such components.

The three registers are adapted to be driven by a clock signal originating from a clock device 28. As is well-known to those skilled in the art; the clock signal from the clock 28 will be subjected to certain insertion delays as it is distributed to each of the registers; and the insertion delays for the registers 12, 14 and 16 are represented in FIG. 1 by blocks 32, 34 and 36, respectively. In FIG. 1, the three registers 12, 14 and 16 are represented by three flip-flops FFa, FFb and FFc, and their corresponding insertion delays 32, 34 and 36 by $\delta a$, $\delta b$ and $\delta c$.

The following expressions formulate the basic clock scheduling requirements which must be fulfilled for a circuit such as shown in FIG. 1 to be functionally correct:

$$\begin{cases} \delta_i - \delta_j \leq T - D_{\max[i,j]} \\ \delta_i - \delta_j \geq -D_{\min[i,j]} \end{cases} \quad (1)$$

for all i, j where there is a combinational path from the output of register i to the input of register j, and wherein:

$\delta i$ and $\delta j$ are the insertion delays of the clock net from the source to the clock sinks i and j;

T is the clock cycle time;

Dmax[i,j] is the longest combinational delay from the output of register i to the input of register j; and Dmin[i,j] is the shortest combinational delay from the output of register i to the input of register j.

In the interest of simplicity, the formulation in Equation 1 above is limited to ideal rising-edge flip-flops. It will be readily recognized by those skilled in the art that, without undue difficulty, the formulation may be extended to cover latches, falling-edge registers, and multi-cycle paths. It may furthermore be extended to take setup times, hold times and propagation delays of the storage elements into account.

Values for the components $\delta i$ of the vector $\delta$ such that the conditions of Equation 1 are met are found by "clock scheduling". As indicated previously, the most common clock scheduling method is to create a clock distribution so that the variance in $\delta$ is minimized, i.e., there is a minimum clock skew distribution. Performance-directed clock scheduling, as is known in the prior art, also seeks to find values for $\delta$ such that T can be reduced, the clock frequency increased, and the throughput improved.

The present invention, on the other hand, seeks to find values for $\delta$ such that the variance of $\delta$ among the components in the circuit is maximized, given certain robustness constraints.

As used herein, the term "robustness" generally implies "robustness with respect to uncontrollable variations in clock arrival times at some register". In addition:

The "local" robustness at register j for a fixed clock schedule may be defined as the smallest change of $\delta j$ which will cause the scheduling requirements of Equation 1 to be violated.

A local change to the schedule can increase the local robustness by centering $\delta j$ in its allowable range. The "potential" local robustness is defined as half of the range of $\delta j$ allowed by the constraints imposed by all combinational blocks connected to the inputs and outputs of the register, with the clock insertion delays of the neighboring registers held constant.

"Global" robustness may be similarly defined as half of the allowable range of $\delta j$ when the clock insertion delays for the other registers of the design are free variables.

The "overall" global robustness, finally, can be defined as the lowest global robustness value for any register j of the design.

Large differences between the longest and the shortest combinational delay of a logic block reduce local robustness; accordingly, when such logic blocks occur generally, global robustness is reduced. The overall global robustness is limited by loops in the directed graph of registers (nodes) and logic blocks (edges), especially such loops containing many blocks with both short and long paths, and also by scheduling constraints on input and output ports.

The overall global robustness, as defined above, is a measure of the degree of difficulty to implement any clock distribution network which will allow the circuit to work as intended. In a typical design, the global robustness will be very different for different registers some logic blocks will be more critical than others. Importantly, it should be recognized that maximizing global robustness for registers whose global robustness is already high does not improve the overall implementability of the clock distribution network.

In accordance with an embodiment of the present invention, the insertion delays in the clock network are constrained such that the overall global robustness reaches the maximum value allowed by loops, combinational blocks and external scheduling constraints. Within these new limits, the insertion delays (δi for all i) are chosen such that their variance is maximized. The objective is to achieve a clock schedule that minimizes the problems caused by simultaneous switching while, at the same time, not making the clock distribution network more difficult to realize than is necessary.

Since the variance is a quadratic form, Quadratic Programming (which is a well-known optimization method) may be used to find a set of values for δ that maximize the variance given the robustness constraints.

In practicing the present invention as described above, blindly imposing a difference in arrival time for clock signals to reach adjacent registers might get costly in gate count and routing congestion. According to a further embodiment of the invention, this problem can be alleviated by adding the additional constraint of keeping δi–δj small for closely placed registers while letting it be larger for registers which are placed far apart. Such a constraint may be included in the overall optimization problem.

It is also possible that some circuits may contain too closely coupled loops which may limit the amount of robustness that can be reached. This problem can be helped by improving the potential robustness in advance. In this regard, there are several improvements that can be made:

a) Adding buffers to make the shortest paths longer. This can easily be done using logic synthesis tools that are currently available.

b) Optimize logic for maximizing the min-delays, which is a novel logic optimization objective.

c) Impose opposite edge devices, flip-flops or latches, for increasing the scheduling freedom. The locations at which these should be added in the circuit could be determined by identifying the closely coupled circuits that put limits on the clock scheduling for robustness.

The increased freedom provided from a), b) and c) above could be used for clock scheduling for either improved robustness, improved clock frequency, improved EMI and IR-drop properties, or any combination of the above.

Figure 2:
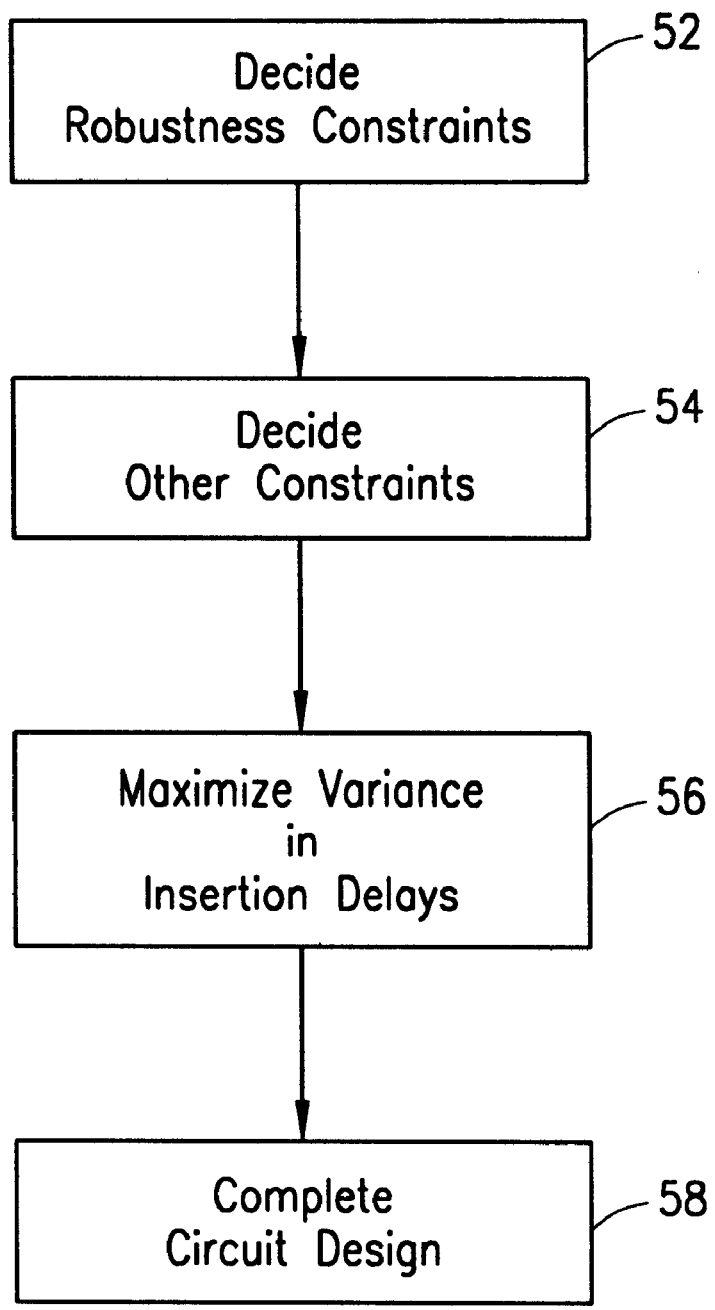
FIG. 2 is a flow chart illustrating steps of a digital circuit design method according to a presently preferred embodiment of the invention.

FIG. 2 is a flow chart that summarizes steps of a method for designing a digital circuit according to a presently preferred embodiment of the invention. Initially, one or more constraints to be placed on the design of the circuit are decided. The one or more constraints include one or more constraints on robustness, as illustrated by block 52, and may include one or more additional constraints as described above and as illustrated by block 54. Once the constraints on the circuit design are decided, values for the insertion delay to each of the plurality of storage elements are selected such that the variance of the insertion delays among the storage elements are maximized, subject to the one or more constraints as illustrated by block 56. Thereafter, design of the circuit is completed as illustrated by block 58.

As indicated previously, a system that uses a clock distribution scheme according to the present invention is more robust against uncontrollable clock skew and has better EMI and IR-drop properties than a system that uses the prevailing maximally balanced scheme, or a system that has been optimized for performance only.

It should be emphasized that the term "comprises/comprising" when used in this specification is taken to specify the presence of stated features, integers, steps or components, but does not preclude the presence or addition of one or more other features, integers, steps, components or groups thereof.

It should also be emphasized that while what has been described herein constitutes presently preferred embodiments of the invention, it is to be recognized that the invention can take numerous other forms. Accordingly, it should be understood that the invention should be limited only insofar as is required by the scope of the following claims.

What is claimed is:

1. A method for designing a digital circuit that includes a plurality of storage elements connected to combinational logic, each of the plurality of storage elements being driven by a clock signal distributed to said plurality of storage elements from a clock device, said method comprising:

subjecting the clock signal distributed to each of said plurality of storage elements to an insertion delay; and substantially maximizing clock skew in said circuit subject to one or more constraints on the design of said circuit, wherein said step of substantially maximizing clock skew comprises selecting values for said insertion delays such that the variance in insertion delays among the storage elements is maximized subject to the one or more constraints.

2. The method according to claim 1, wherein said step of selecting values for said insertion delays comprises using Quadratic Programming for finding said values.

3. The method according to claim 1, wherein said one or more constraints comprise one or more robustness constraints.

4. The method according to claim 3, wherein said one or more robustness constraints comprises a constraint that overall global robustness achieves a maximum value allowed by loops and combinational blocks in said circuit and external scheduling constraints.

5. The method according to claim 3, wherein the one or more constraints include a constraint to lengthen the shortest paths in said circuit.

6. The method according to claim 3, wherein the one or more constraints include a constraint for maximizing min-delays.

7. The method according to claim 1, wherein basic clock scheduling requirements which must be fulfilled for the circuit are defined as follows:

$$\begin{cases} \delta_i - \delta_j \leq T - D_{\max[i,j]} \\ \delta_i - \delta_j \geq -D_{\min[i,j]} \end{cases}$$

for all i, j where there is a combinational path from the output of a storage device i to the input of a storage device, and wherein:

δi and δj are the insertion delays of the clock net from the clock source to clock sinks i and j; T is the clock cycle time; Dmax is the longest combinational delay from the output of storage device i to the input of storage device j; and Dmin is the shortest combinational delay from the output of storage device i to the input of storage device j, and wherein values for $\delta$ are selected such that the variance among the storage device is maximized subject to robustness constraints.

8. The method according to claim 7, wherein a robustness constraint is that $\delta_i - \delta_j$ is kept small for closely spaced storage devices and large for storage devices which are spaced farther apart.

9. A method for designing a digital circuit that includes a plurality of storage elements connected to combinational logic blocks, each of the plurality of storage elements being driven by a clock signal distributed to said plurality of storage elements from a clock device, said method comprising:

selecting one or more constraints on the design of said circuit;

subjecting said clock signal to certain insertion delays as said clock signal is distributed to each of said plurality of storage elements; and substantially maximizing clock skew in said circuit subject to said one or more selected constraints, wherein said step of maximizing clock skew comprises the step of selecting values for said insertion delays such that the variance of the insertion delays among said plurality of storage elements is substantially maximized subject to said one or more constraints.

10. The method according to claim 9, wherein said one or more constraints include one or more robustness constraints.

11. The method according to claim 10, wherein said one or more robustness constraints includes that overall global robustness reaches a maximum value allowed by loops and combinational blocks in the circuit and external scheduling constraints.

12. A synchronous digital circuit comprising:

a plurality of storage elements connected to combinatorial logic blocks, each of said plurality of storage elements being driven by a clock signal, said clock signal being subjected to certain insertion delays as the clock signal is distributed to each of said plurality of storage elements, wherein values of each of said insertion delays are selected such that the variance of the insertion delays among the storage elements is maximized subject to one or more constraints on the design of said circuit.

13. The circuit according to claim 12, wherein said one or more constraints include one or more robustness constraints.

14. A method for designing a digital circuit that includes a plurality of storage elements connected to combinational logic, each of the plurality of storage elements being driven by a clock signal distributed to said plurality of storage elements from a clock device, said method comprising:

substantially maximizing clock skew in said circuit subject to one or more robustness constraints on the design of said circuit, wherein said one or more robustness constraints comprises one or more of a constraint that overall global robustness achieves a maximum value allowed by loops and combinational blocks in said circuit and external scheduling constraints, a constraint to lengthen the shortest paths in said circuit, and a constraint for maximizing min-delays.

15. A method for designing a digital circuit that includes a plurality of storage elements connected to combinational logic blocks, each of the plurality of storage elements being driven by a clock signal distributed to said plurality of storage elements from a clock device, said method comprising:

selecting one or more robustness constraints on the design of said circuit; and substantially maximizing clock skew in said circuit subject to said one or more selected robustness constraints, wherein said one or more robustness constraints includes a constraint that overall global robustness reaches a maximum value allowed by loops and combinational blocks in the circuit and external scheduling constraints.

* * * * *